United States Patent

Sher et al.

[11] Patent Number: 6,140,692
[45] Date of Patent: Oct. 31, 2000

[54] ISOLATED ANTI-FUSE STRUCTURE AND METHOD FOR FABRICATING SAME

[75] Inventors: Joseph C. Sher, Meridian; Robert M. Gravelle, Boise, both of Id.

[73] Assignee: Micron Technology, Inc., Boise, Id.

[21] Appl. No.: 08/865,282

[22] Filed: May 29, 1997

[51] Int. Cl.$^7$ .................................................. H01L 29/00
[52] U.S. Cl. .............................................. 257/530; 257/50
[58] Field of Search ....................................... 257/50, 530

[56] References Cited

U.S. PATENT DOCUMENTS

| | | | |
|---|---|---|---|
| 4,072,975 | 2/1978 | Ishitani | 257/339 |
| 4,569,121 | 2/1986 | Lim et al. | 29/574 |
| 5,648,678 | 7/1997 | Begley et al. | 257/529 |

OTHER PUBLICATIONS

Microelectronic Processing, W. Scot Ruska, pp. 311–317, 1987.

*Primary Examiner*—David Hardy
*Assistant Examiner*—George C. Eckert, II
*Attorney, Agent, or Firm*—Dorsey & Whitney LLP

[57] ABSTRACT

An improved anti-fuse structure is formed on a silicon substrate of a first conductivity type. The anti-fuse has a first conductive layer formed on a surface of the substrate, a dielectric layer formed on the first conductive layer, and a second conductive layer formed on the dielectric layer. The second conductive layer has a portion extending beyond the dielectric layer above the surface of the substrate. A third conductive layer is contacted to this portion of the second dielectric layer. The anti-fuse further includes a well region having a graded doping profile formed in the silicon substrate under the portion of the second conductive layer to which the third conductive layer is contacted. The well region has a second conductivity type that is opposite the first conductivity type.

31 Claims, 4 Drawing Sheets

ISOLATED ANTI-FUSE STRUCTURE AND METHOD FOR FABRICATING SAME

TECHNICAL FIELD

The present invention relates generally to an anti-fuse structure in a semiconductor integrated circuit and, more specifically, to an improved anti-fuse structure allowing more reliable programming and sensing of the anti-fuse by preventing defects caused by overetching of contact holes during formation of the anti-fuse.

BACKGROUND OF THE INVENTION

Anti-fuses typically comprise a dielectric layer, such as an oxide or nitride, formed between two conductive plates. The anti-fuse presents a high impedance between the conductive plates before being "blown" or programmed, and a relatively low impedance between the conductive plates after being programmed. To program the anti-fuse, a programming voltage of a sufficient magnitude is applied across the conductive plates causing a "breakdown" of the dielectric layer which results in the dielectric layer having a relatively low impedance. Anti-fuses are used in a variety of applications, including selectively enabling or disabling components on a semiconductor integrated circuit. For example, in a dynamic random access memory anti-fuses are used to enable redundant rows of memory cells which are used to replace defective rows of memory cells and thereby allow an otherwise defective memory to be utilized.

FIG. 1 illustrates the structure of a conventional anti-fuse 10 formed on a silicon substrate 12 having a particular conductivity type which, in the embodiment of FIG. 1, is p$^-$-type. The anti-fuse 10 includes a field oxide region 14 formed in the p$^-$-type substrate 12 in a conventional manner to provide isolation of various regions formed in the substrate. An insulation layer 16, typically a deposited silicon dioxide or TEOS layer, is formed on a surface 13 of the p$^-$-type substrate 12 and covers the field oxide region 14 to provide insulation between the substrate 12 and other components of the anti-fuse 10. A portion of the insulation layer 16 is removed in a conventional manner, such as chemical etching, to expose an area on the surface 13 of the p$^-$-type substrate 12. A first polysilicon layer 18 is formed to contact the surface 13 in the exposed area as shown and provides a first conductive plate of the anti-fuse 10. A dielectric layer 20, typically made of silicon nitride, is conformally formed on the first polysilicon layer 18 to provide the dielectric layer of the anti-fuse 10 which is broken down during programming of the anti-fuse. A second polysilicon layer 22 is formed to conformally cover the dielectric layer 20 and extends onto the surface of the insulation layer 16 to thereby provide a second conductive plate of the anti-fuse 10.

The anti-fuse 10 further includes regions 24–28 having a conductivity type opposite that of the p$^-$-type substrate 12 formed in the substrate 12. In the example of FIG. 1, these regions comprise the lightly doped n$^-$-type regions 24 and 26 and a more heavily doped n$^+$-type region 28. The more heavily doped n$^+$-type region 28 is formed to improve contact resistance (resistance occurring at a polysilicon-metal junction) between the first polysilicon layer 18 and a metal layer to be described in more detail below. Typically, the regions 24–26 are formed through conventional ion implantation before the formation of the second polysilicon layer 22. During ion implantation, the second polysilicon layers 18 and 22 act as shields to implantation and thus the n$^-$-type regions 24 and 26, which are beneath the polysilicon layers 18 and 22, are more lightly doped than the region 28 which is not covered by the polysilicon layers 18 and 22. It should be noted that the n$^-$-type region 24 is formed incidentally during the implantation forming the regions 26 and 28 and is not required for proper functionality of the anti-fuse 10.

An insulating layer 30, typically made of boron phosphorous silicon glass, is formed on the second polysilicon layer 22 and on areas of the substrate 12 not underneath the second polysilicon layer 22 such as the portion of the surface 13 of the substrate 12 above the n$^+$-type region 28. The insulating layer 30 provides a passivation cover over the anti-fuse 10 to protect the anti-fuse components from external hazards. A pair of contact holes 32 are formed in the insulating layer 30 above the n$^-$-type region 24. The contact holes 32 extend from the upper surface of the insulating layer 30 to the upper surface of the second polysilicon layer 22. A metal layer 34 is formed in a conventional manner in the contact holes 32 and on the upper surface of the insulating layer 30 to thereby make contact with the second polysilicon layer 22 and form a first terminal of the anti-fuse 10. Similarly, a pair of contact holes 36 are formed above the n$^+$-type region 28 extending from the upper surface of the insulating layer 30 to the surface 13 of the substrate 12. A metal layer 38 is likewise formed in these contact holes and on the upper surface of the insulating layer 30 to thereby provide a second terminal of the anti-fuse 10. The metal layer 38 is connected to the first polysilicon layer 18 through the n$^{31}$-type region 26 and n$^+$-type region 28 which, as previously described, lower the contact resistance between the metal layer 38 and the first polysilicon layer 18.

Typically, the contact holes 32 are formed by etching the insulating layer 30 until the upper surface of the second polysilicon layer 22 is exposed. Ideally, the etching should stop precisely at the upper surface of the second polysilicon layer 22 and not extend into or beyond the second polysilicon layer 22. Because of limited control over the etching process, as well as the second polysilicon layer 22 normally being very thin, there is a high probability that these contact holes 32 will be overetched, meaning that the contact holes extend into or beyond the second polysilicon layer 22 and thus make contact with the structures below the second polysilicon layer 22.

Two potential scenarios for overetching of the contact holes 32 are illustrated by the dashed lines 40 and 42 in FIG. 1. In a first scenario indicated by the dashed lines 40, the contact hole 32 has been etched through the second polysilicon layer 22 into and through the insulation layer 16 and into the n$^-$-type region 24. When this occurs, programming and sensing of the anti-fuse 10 may be adversely affected in two primary ways. First, when the anti-fuse 10 is being programmed, programming voltages V$_{PP1}$ and V$_{PP2}$ are applied, respectively, to the metal layers 34 and 38. If the contact hole 32 has been overetched as indicated by the dashed lines 40, the programming voltage V$_{PP1}$ applied to the metal layer 34 is also applied to the n$^-$-type region 24. The pn-junction of the n$^-$-type region 24 and the p$^-$-type substrate 12 forms a diode 44 which is reverse biased by the application of voltage V$_{PP1}$ to its cathode and a back bias voltage V$_{bb}$ to its anode. As known in the art, the diode 44 has a reverse breakdown voltage which, when exceeded, results in a large current flow from the cathode to the anode. The reverse breakdown voltage of the diode 44 is determined by the physical sizes and doping of the region 24 and substrate 12 and is typically on the order of 12 volts for the conventional anti-fuse 10. Typically, the programming voltage V$_{PP1}$ applied to the metal layer 34 is on the order of 12.2 volts and the back bias voltage V$_{bb}$ applied to the substrate 12 is on the order of −0.9 volts, thus applying a voltage of approximately 13.1 volts across the diode 44 and causing breakdown of the diode 44. This breakdown of the diode 44 and the resulting current flow from the n⁻-type region 24 to the p⁻-type substrate 12 may result in an insufficient programming voltage being applied to the second polysilicon layer 22 and unreliable programming of the anti-fuse 10. The breakdown of diode 44 can often times be permanent.

In addition, permanent breakdown of the diode 44 may result in a larger than normal leakage current through the diode 44 even when no programming voltage $V_{PP1}$ is applied to the metal layer 34 and the voltage on the metal layer 34 may thereby be pulled to such a level that the anti-fuse 10 may be sensed by other circuitry (not shown) on the semiconductor circuit as having been programmed when in fact it has not been programmed. FIG. 2 is a functional schematic diagram of the anti-fuse 10 as it may be connected during sensing by circuitry on the semiconductor integrated circuit containing the anti-fuse. As shown, the metal layer 38 is coupled to ground and metal layer 34 is coupled to a sense terminal SENSE which is also coupled to a supply voltage $V_{CC}$ through a pull-up resistor 46. The polysilicon layer 18, dielectric layer 20, and polysilicon layer 22 are indicated schematically by a structure 48. When the anti-fuse 10 has not been programmed, the voltage on metal layer 34 should be approximately $V_{CC}$ since the structure 48 presents a high impedance and layer 34 is thereby isolated from layer 38 and ground. Excessive leakage current through the reverse biased diode 44, however, could result in a voltage drop across the pull-up resistor 46 sufficient to cause the voltage on the sense terminal SENSE to drop below a threshold level and be sensed as being low by circuitry on the integrated circuit even when the anti-fuse 10 has not been programmed.

A second dotted line 42 in FIG. 1 indicates a second potential scenario occurring when at least one of the contact holes 32 is overetched. In this situation, the contact hole 32 has been overetched such that it extends through the n⁻-type region 24, which has a depth of $d_r$, and into the substrate 12 resulting in a direct short circuit between the metal layer 34 and the substrate 12. When this type of defect occurs, programming of the anti-fuse 10 is prevented since the positive programming voltage $V_{PP1}$ is shorted directly to the negative back bias voltage $V_{bb}$ and failure of the semiconductor circuit containing the anti-fuse 10 will most likely occur.

There is a need for an anti-fuse structure allowing reliable programming and sensing of the anti-fuse and preventing defects occurring from the overetching of contact holes during formation of the anti-fuse.

SUMMARY OF THE INVENTION

An anti-fuse is formed on a silicon substrate of a first conductivity type. The anti-fuse has a first conductive layer formed on a surface of the substrate. A dielectric layer is formed on the first conductive layer and a second conductive layer is formed on the dielectric layer. The second conductive layer has a portion extending beyond the dielectric layer above the surface of the substrate to which a third conductive layer is contacted. The anti-fuse further includes a well region of a second conductivity type which is opposite the first conductivity type. The well region has a graded doping profile and is formed in the silicon substrate under the portion of the second conductive layer to which the third conductive layer is contacted.

In one embodiment, an anti-fuse is fabricated on a silicon substrate of a first conductivity type. A first lightly doped region of a second conductivity type opposite that of the first conductivity type, is formed in the substrate and a second more heavily doped region of the second conductivity type is formed adjoining the first lightly doped region. A first well region of the second conductivity type has a graded doping profile and is formed in the substrate spaced apart from the first lightly doped region and the second more heavily doped region. A first polysilicon layer is formed on the first lightly doped region, and a dielectric layer is formed on the first polysilicon layer. A second polysilicon layer is formed on the dielectric layer and includes a portion extending above the first well region. A first metal layer is formed to contact the second polysilicon layer at the portion of the second polysilicon layer above the first well region, and a second metal layer is formed to contact the second more heavily doped region.

In another embodiment, a shallower more lightly doped region of the second conductivity type is formed within the well region.

In yet another embodiment, the anti-fuse further comprises a second well region of the second conductivity type formed in the substrate so that the first lightly doped and second more heavily doped regions are within the second well region.

DETAILED DESCRIPTION OF THE INVENTION

Figure 3:
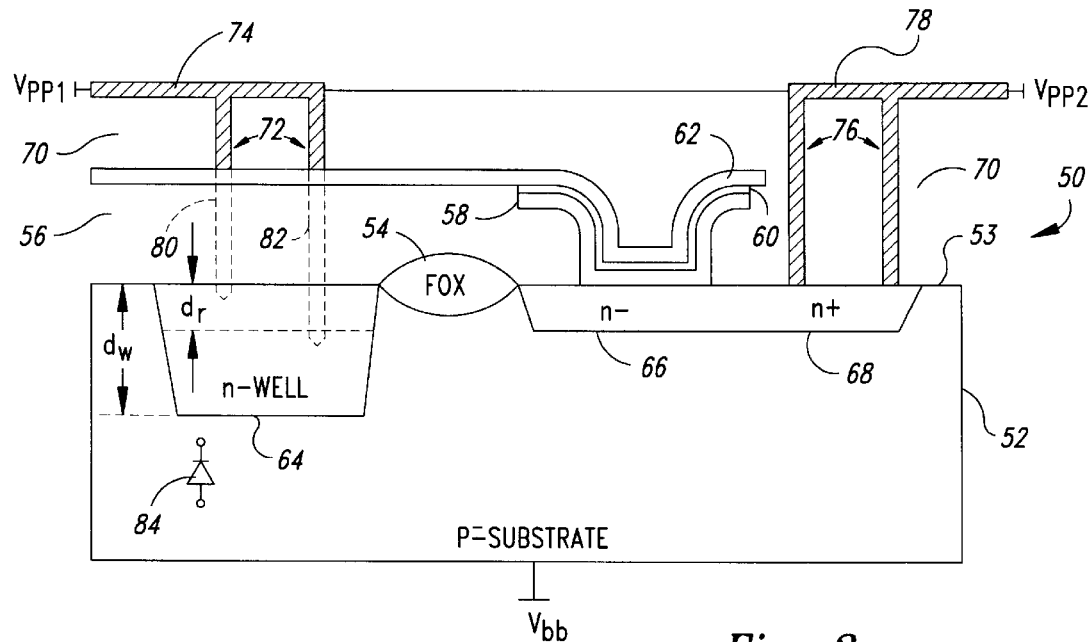
FIG. 3 is a cross-sectional view of an anti-fuse having a well region according to one embodiment of the present invention.

FIG. 3 is a cross-sectional view of an anti-fuse 50 according to one embodiment of the present invention. The anti-fuse 50 is formed in a substrate 52 doped to have a first conductivity type which, in the embodiment of FIG. 3, is p⁻-type. A field oxide region 54 is formed in the substrate 52 in a conventional manner and provides isolation between various components of the anti-fuse 50. An insulation layer 56 is formed on a surface 53 of the substrate 52 and covers the field oxide region 54. A portion of the insulation layer 56 is removed to expose an area on the surface 53 of the substrate 52 and a first polysilicon layer 58 is formed on the surface 53 in this removed portion of the insulation layer 56 to provide a first conductive plate of the anti-fuse 50. A dielectric layer 60 is formed as shown on the first polysilicon layer 58 to provide an insulation layer which is broken down and caused to assume a relatively low impedance value during programming of the anti-fuse 50. A second polysilicon layer 62 is formed on the dielectric layer 60 and extending onto the surface of the insulation layer 56 as shown to provide a second conductive plate of the anti-fuse 50.

Typically, before formation of the second polysilicon layer 62, a well region 64 is formed in the p⁻-type substrate 52 through ion implantation and diffusion of a dopant or dopants having the desired conductivity type, which is opposite that of the substrate 52 and is n-type in the embodiment of FIG. 3. For example, a high energy implantation of phosphorous and a lower energy shallower implantation of arsenic may be formed and then thermally diffused to drive the dopants deeper into the substrate 52. The diffusion of the phosphorous and arsenic dopants decreases their doping concentration and results in a graded doping profile for the n-well region 64. This graded doping profile results in a graded pn-junction formed by the n-well region 64 and p-type substrate 52 which, as known in the art, has a considerably higher reverse breakdown voltage than does a pn-junction such as diode 44 of FIG. 1 which is formed by two oppositely doped regions having an abrupt change in doping concentration at the junction. The n-well region 64 has a depth $d_w$ from the surface 53 of the substrate 52, the depth $d_w$ being significantly greater than the depth of the region 24 of the prior art anti-fuse 10 shown in FIG. 1. For example, the n-well region 64 may have a depth $d_w$ on the order of 3 microns while the region 24 of the prior art anti-fuse 10 has a depth on the order of only 0.5 microns.

Also formed in the p⁻-type substrate 52 through ion implantation of a dopant having a conductivity type opposite that of the substrate 12 are a lightly doped region 66 and a more heavily doped region 68. This ion implantation results in the formation of the n⁻-type region 66 and n⁺-type region 68 which lower the overall resistance between the first polysilicon layer 58 and a metal layer forming a terminal of the anti-fuse 50 as was described with reference to FIG. 1. The n⁻-type region 66 is more lightly doped than the n⁺-type region 68 due to shielding of the region 66 by the polysilicon layers 58 and 62 during ion implantation.

Once the regions 64–68 have been formed, an insulating layer 70, typically made of boron phosphorous silicon glass, is formed on the second polysilicon layer 62 and on areas of the substrate 52 not underneath the second polysilicon layer 62, such as above the region 68, to provide a protective cover over the anti-fuse 50. After the insulating layer 70 is formed, contact holes 72 are formed in the insulating layer 70 by, as previously described with reference to FIG. 1, etching the insulating layer 70 in a conventional manner. A metal layer 74 is formed in the contact hole 72 and on the surface of the insulating layer 70 to provide one terminal of the anti-fuse 50 for receiving a first programming voltage $V_{PP1}$. In the same way, a second pair of contact holes 76 are formed through the insulating layer 70 to the surface 53 of the substrate 52 by etching the insulating layer 70 and a metal layer 78 is formed in the contact holes 76 and on the insulating layer 70 to thereby provide a second terminal of the anti-fuse 50 for receiving a second programming voltage $V_{PP2}$.

Figure 1:
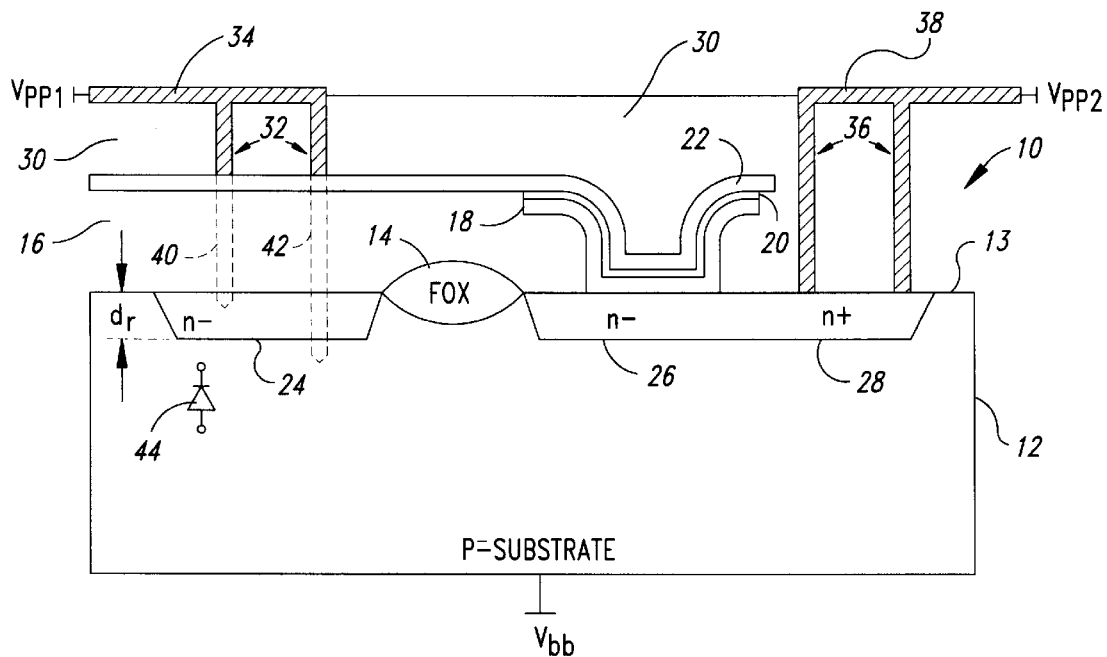
FIG. 1 is a cross-sectional view of a conventional anti-fuse formed on a silicon substrate of an integrated circuit.
Figure 2:
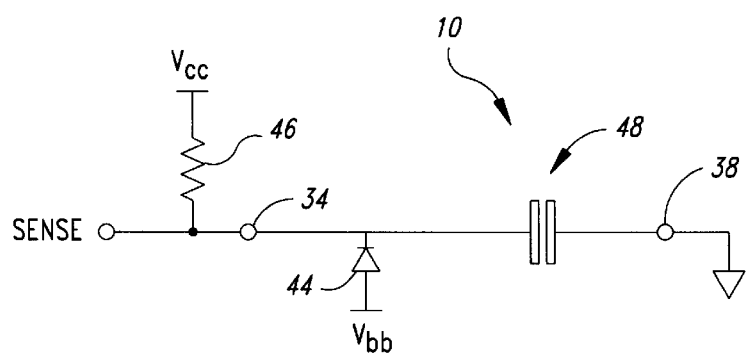
FIG. 2 is a functional schematic diagram of the anti-fuse of FIG. 1 connected during sensing by circuitry on the integrated circuit containing the anti-fuse.

The utilization of the n-well region 64 provides several advantages over the prior art anti-fuse structure described with reference to FIG. 1. First, as indicated by the dotted lines 80 and 82, overetching of the contact hole 72 to a depth greater than $d_r$ does not result in a direct short circuit between the metal layer 74 and the substrate 52 as was the case in the prior art circuit of FIG. 1. Second, as previously discussed, the greater depth $d_w$ and graded doping profile of the n-well region 64 result in the graded pn-junction formed by the n-well region 64 and the p⁻-type substrate 52, as indicated by a diode 84. The diode 84 has a breakdown voltage which is significantly greater than the diode 44 of the prior art anti-fuse 10, typically being on the order of 40 volts while, as previously described, the breakdown voltage of the diode 44 is on the order of 12 volts. Thus, no breakdown of the diode 84 results from application of the first programming voltage $V_{PP1}$ to the metal layer 74 and thus no current is drained from the second polysilicon layer 62 thereby providing reliable breakdown of the dielectric layer 60 during programming of the anti-fuse 50. In addition, because there was no breakdown of the diode 84, there will be no excessive leakage current through the diode 84 and no accompanying possibility for erroneous sensing of the anti-fuse 50 as was possible with the prior art circuit. The n-well region 64 results in the anti-fuse 50 being unaffected by the same overetching defects which interfere with the programming and sensing of prior art anti-fuse structures.

Figure 4:
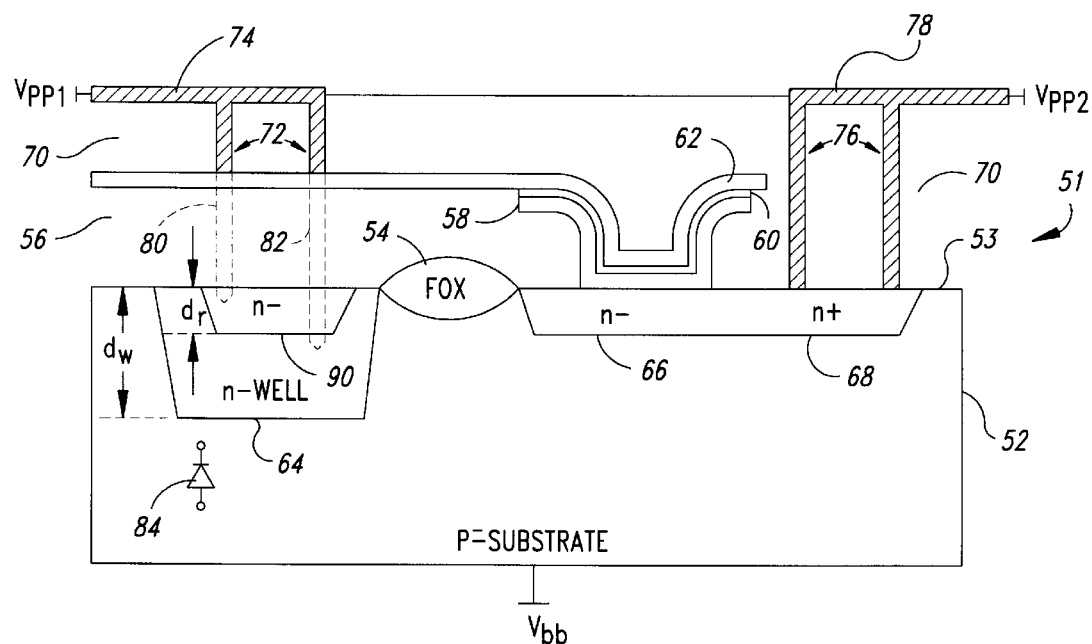
FIG. 4 is a cross-sectional view of another embodiment of an anti-fuse having a well region and a shallower more lightly doped region formed within the well region according to another embodiment of the present invention.

A second embodiment of an anti-fuse 51 according to the present invention is shown in FIG. 4. For the sake of brevity and ease of explanation, components of the anti-fuse 51 that are common to the embodiment of FIG. 3 have been given the same reference numbers and will not be described in more detail. The anti-fuse 51 of FIG. 4 is identical to that of FIG. 3 except for the inclusion of a shallower more lightly doped region 90 having the same conductivity type as the region 66 which, in the embodiment of FIG. 3, is n⁻-type. The region 90 is contained within the n-well region 64 and is typically formed by the same ion implantation utilized to form the regions 66 and 68. By including the n⁻-type region 90 in the anti-fuse 51, the structure of the existing anti-fuse 10 of FIG. 1 is preserved while interference with proper programming and sensing of the anti-fuse is improved by the inclusion of the n-well region 64.

Figure 5:
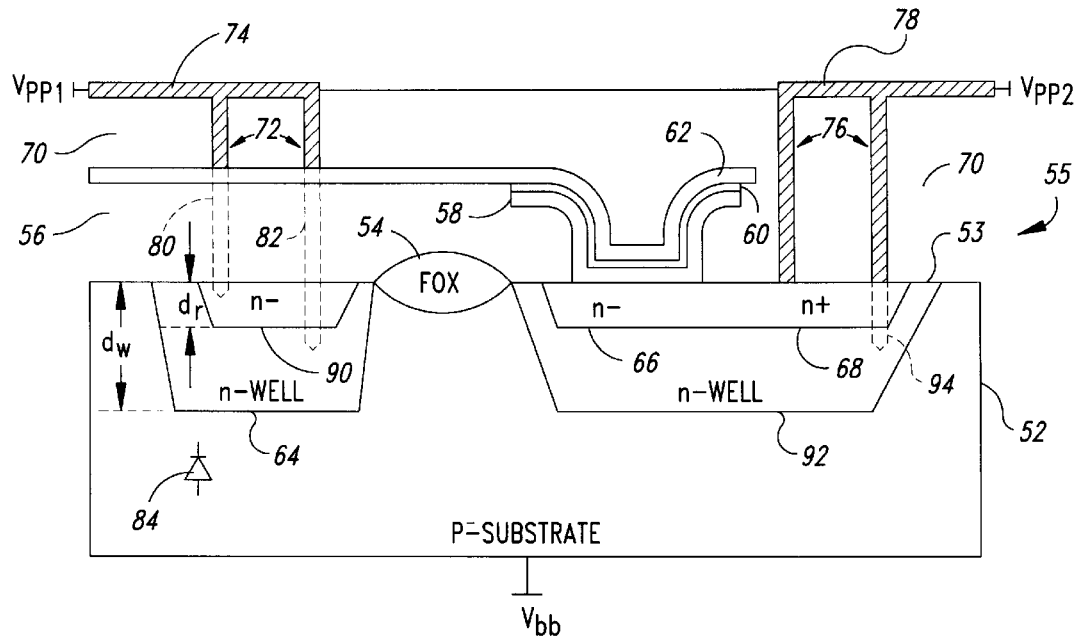
FIG. 5 is a cross-sectional view of another embodiment of an anti-fuse having first and second well regions according to another embodiment of the present invention.

FIG. 5 illustrates another embodiment of an anti-fuse 55 according to the present invention in which common components have once again been given the same reference numerals. This embodiment is the same as that described with reference to FIG. 4 except for the inclusion of a second well region 92 having the same conductivity type as the well region 64, which in the embodiment of FIG. 4, is n-type. The n-well region 92 is typically formed at the same time and in the same manner as the n-well region 64 to provide protection from overetching of the contact holes 76. As illustrated by the dotted lines 94, overetching of one of the contact holes 76 could result in the contact hole being etched through the region 68 and, in the absence of the n-well region 92, result in a short circuit between the metal layer 78 and the substrate 52 which could adversely affect the programming and sensing of the anti-fuse 55 as previously described. The inclusion of the n-well region 92, however, makes it less likely that overetching of the contact hole 76 will result in a short circuit between the metal layer 78 and the substrate 52 and thus programming and sensing of the anti-fuse 55 are not affected by such overetching. By utilizing the n-well regions 64 and 92, protection against overetching of either or both of the contact holes 72 and 76 is provided and the likelihood of overetching resulting in a defective anti-fuse 55 is accordingly reduced. It should be noted that programming of the anti-fuse 55 is polarity insensitive in that the polarity of the programming voltages $V_{PP1}$ and $V_{PP2}$ is irrelevant so either or both may be positive or negative. In contrast, the anti-fuses 50 and 51, as was the prior art anti-fuse 10, are limited in the magnitude of the negative programming voltage $V_{PP2}$ that can be applied to the metal layer 78 without forward biasing the pn-junction formed by the n⁺-region 68 and p⁻-type substrate 52.

In all embodiments of the anti-fuse according to the present invention, the dimensions of the n-well region 64 parallel to the surface 53 can be increased to allow a plurality of anti-fuses to have their associated metal layers 74 formed over a single enlarged n-well region 64. The same is true of the n-well region 92 of the anti-fuse 55 in FIG. 5. One skilled in the art will also realize that while all embodiments of the anti-fuses according to the present invention are comprised of n-well regions formed on a p⁻-type substrate, the conductivity type of the various components of the anti-fuse may be inverted. For example, an anti-fuse could be formed on an n-type substrate having p-well regions.

Figure 6:
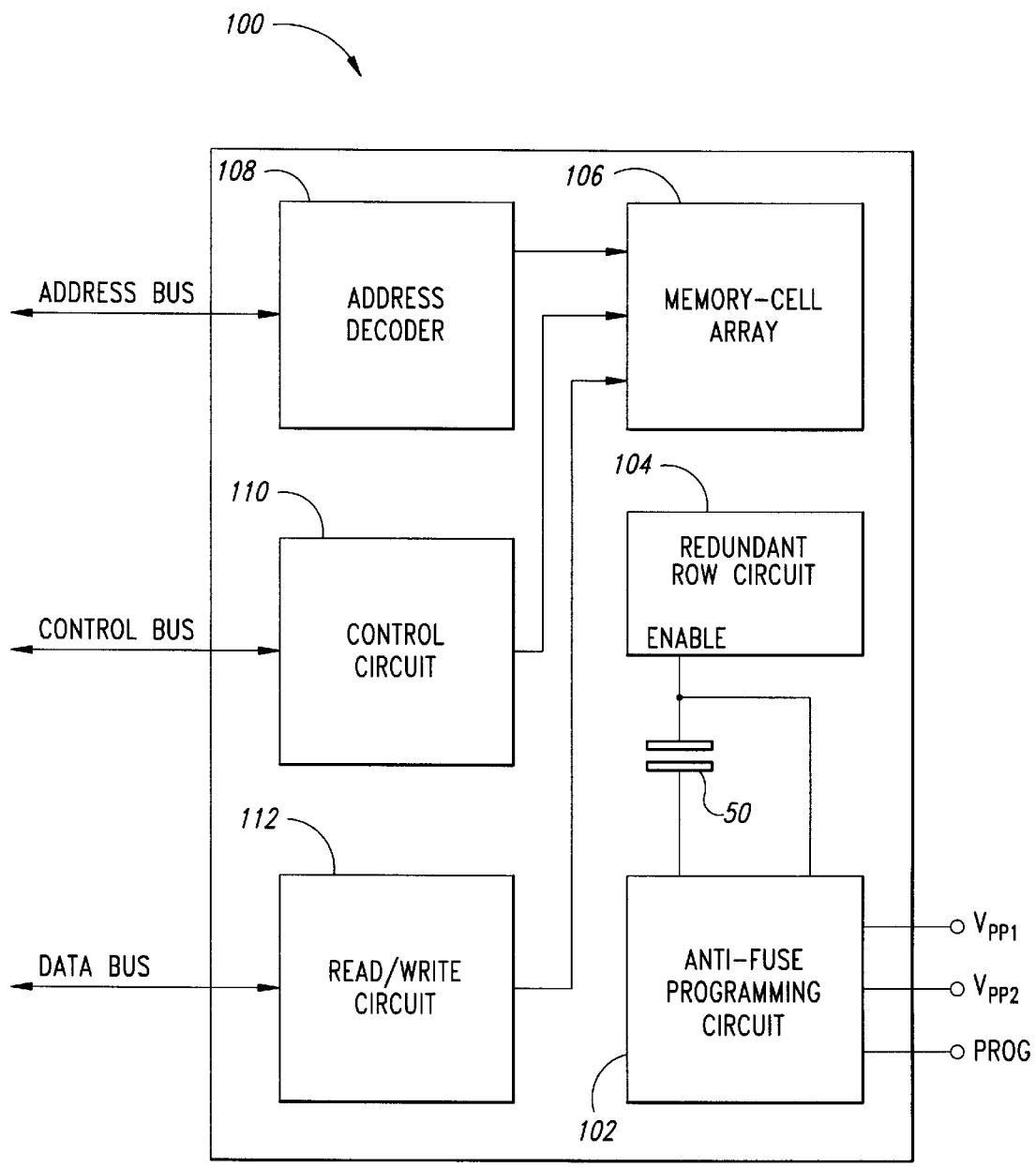
FIG. 6 is a block diagram of a memory device including an anti-fuse according to one of the embodiments of FIGS. 2–4.

FIG. 6 is a block diagram of a memory device 100 which includes the anti-fuse 50 according to the present invention. While the anti-fuse 50 is shown, the anti-fuses 51 and 55 could of course be included in the memory device 100 as well. An anti-fuse programming circuit 102 is shown as receiving on external terminals of the memory device 100 programming voltages $V_{PP1}$ and $V_{PP2}$, and an input PROG which enables the circuit 102. The input PROG could also be generated internal to the memory device 100 in response to the state of signals on other terminals of the device. The programming circuit 102 is typically connected to a plurality of anti-fuses, one of which, the anti-fuse 50, is shown schematically in FIG. 6. One terminal of the anti-fuse 50 is connected to an enable terminal ENABLE of a redundant row circuit 104 containing a plurality of redundant memory cells that are used to replace defective memory cells in a memory cell array 106. The memory device 100 further includes an address decoder 108, control circuit 110, and read/write circuitry 112, all of which are conventional. The address decoder 108, control circuit 110, and read/write circuitry 112 are all coupled to the memory cell array 106. In addition, the address decoder 108 is coupled to an address bus, the control circuit 110 is coupled to a control bus, and the read/write circuit 112 is coupled to a data bus.

In operation, external circuitry controls operation of the memory device 100 including the programming circuit 102 to program the desired anti-fuses 50. When the input PROG is inactive, the terminal of the anti-fuse 50 connected to the circuit 102 is at ground so that the redundant row circuit 104 can sense the state of the anti-fuse 50 on the terminal ENABLE. An active input PROG causes the circuit 102 to couple the programming voltages $V_{PP1}$ and $V_{PP2}$ to respective terminals of the anti-fuse 50 and thereby blow the anti-fuse. When the anti-fuse 50 has been blown, the redundant row circuit 104 operates to replace a row of memory cells in the memory cell array 106 with redundant memory cells contained within the circuit 104. Operation of the address decoder 108, control circuit 110, and read/write circuitry 112 during read and write data transfer operations is conventional and understood by one skilled in the art.

Figure 7:
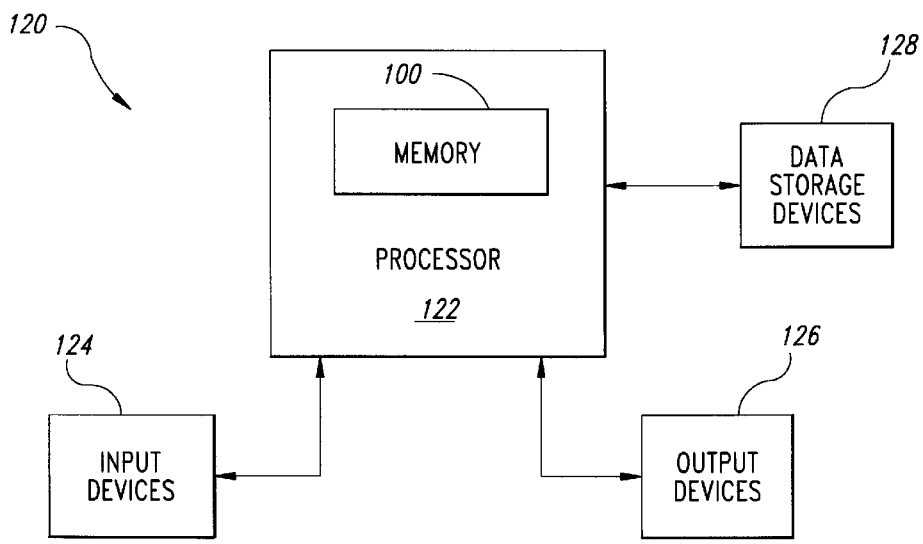
FIG. 7 is a block diagram of a computer system including the memory device of FIG. 6.

FIG. 7 is a block diagram of a computer system 120 which includes the memory device 100 of FIG. 6. The computer system 120 includes a processor 122 for performing various computing functions, such as executing specific software to perform specific calculations or tasks. In addition, the computer system 120 includes one or more input devices 124, such as a keyboard or a mouse, coupled to the processor 122 to allow an operator to interface with the computer system. Typically, the computer system 120 also includes one or more output devices 126 coupled to the processor 122, such output devices typically being a printer or a video terminal. One or more data storage devices 128 are also typically coupled to the processor 122 to store data or retrieve data from external storage media (not shown). Examples of typical storage devices 128 include hard and floppy disks, tape cassettes, and compact disc read-only memories. The processor 122 is typically coupled to the memory device 100 through a control bus, a data bus, and an address bus to provide for writing data to and reading data from the memory device.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

What is claimed is:

1. An anti-fuse formed on a silicon substrate of a first conductivity type, the anti-fuse having a first conductive layer formed on a surface of the substrate, a dielectric layer formed on the first conductive layer, and a second conductive layer formed on the dielectric layer, the second conductive layer having a portion extending beyond the dielectric layer above the surface of the substrate to which a third conductive layer is contacted, the anti-fuse including a well region formed in the silicon substrate under the portion of the second conductive layer to which the third conductive layer is contacted, and further including a shallower more lightly doped region within the well region, the well region and the shallower more lightly doped region having a second conductivity type opposite the first conductivity type.

2. The anti-fuse of claim 1 wherein the well region has an expected depth of at least approximately 3 microns.

3. The anti-fuse of claim 1 wherein the dielectric layer is silicon nitride.

4. The anti-fuse of claim 1 wherein the first and second conductive layers are formed from polysilicon.

5. The anti-fuse of claim 1 wherein the third conductive layer is a metal layer.

6. An anti-fuse formed on a silicon substrate of a first conductivity type, the anti-fuse comprising:

a first conductive layer formed on a surface of the substrate;

a dielectric layer formed on the first conductive layer;

a second conductive layer formed on the dielectric layer having a portion extending beyond the dielectric layer above the surface of the substrate;

a first well region formed in the silicon substrate under at least part of the portion of the second conductive layer extending beyond the dielectric layer above the surface of the substrate, the first well region having a second conductivity type opposite the first conductivity type and having formed within it a more lightly doped region of the second conductivity type formed to a depth more shallow than the depth of the first well region;

a passivation layer formed on the second conductive layer, the passivation layer having at least one contact hole extending through the passivation layer, through the second conductive layer, and into but not through the first well region; and a third conductive layer formed in the at least one contact hole.

7. The anti-fuse of claim 6 wherein the first and second conductive layers are polysilicon layers.

8. The anti-fuse of claim 6 wherein the third conductive layer is a metal layer.

9. The anti-fuse of claim 6 wherein the first well region has an expected depth of at least approximately 3 microns.

10. The anti-fuse of claim 6 wherein the dielectric layer is silicon nitride.

11. The anti-fuse of claim 6 wherein the anti-fuse further includes an insulating layer formed on the surface of the substrate adjoining the first conductive and dielectric layers on which is formed the portion of the second conductive layer extending beyond the dielectric layer above the surface of the substrate, the insulating layer including the at least one contact hole extending through the insulating layer.

12. An anti-fuse formed on a silicon substrate of a first conductivity type, the anti-fuse having a first conductive layer formed on a surface of the substrate, a dielectric layer formed on the first conductive layer, and a second conductive layer formed on the dielectric layer, the second conductive layer having a portion extending beyond the dielectric layer above the surface of the substrate to which a third conductive layer is contacted, the anti-fuse including a well region formed in the silicon substrate under the portion of the second conductive layer to which the third conductive layer is contacted, the well region having an expected depth and a second conductivity type opposite the first conductivity type, the anti-fuse further including a shallow region formed within the well region having a depth less than the expected depth of the well region, the shallow region being more lightly doped than the well region and having the second conductivity type.

13. The anti-fuse of claim 12 wherein the well region has an expected depth of at least approximately 3 microns.

14. The anti-fuse of claim 12 wherein the first and second conductive layers are formed from polysilicon.

15. The anti-fuse of claim 12 wherein the third conductive layer is a metal layer.

16. A polarity insensitive anti-fuse capable of programming by applying voltages of either polarity to first and second terminals of the anti-fuse, the anti-fuse being formed on a substrate having a first conductivity type and including a shallow region formed in the substrate having a second conductivity type opposite the first conductivity type, a first conductive layer being formed on a first portion of the shallow region and the first terminal contacting a second portion of the shallow region adjacent the first portion, a dielectric layer being formed on the first conductive layer and a second conductive layer being formed on the dielectric layer, the second conductive layer having a portion extending beyond the dielectric layer above the surface of the substrate to which the second terminal is contacted, the polarity insensitive anti-fuse comprising a first well region of the second conductivity type formed in the substrate to an expected depth sufficient to contain the shallow region and a second well region of the second conductivity type formed in the substrate under the portion of the second conductive layer contacted by the second terminal, the second well region having an expected depth.

17. The polarity insensitive anti-fuse of claim 16 wherein the expected depth of the first well region is at least approximately 3 microns.

18. The polarity insensitive anti-fuse of claim 16 wherein the expected depths of both the first and second well regions are at least approximately 3 microns.

19. The polarity insensitive anti-fuse of claim 16 wherein the first and second conductive layers are formed from polysilicon.

20. The polarity insensitive anti-fuse of claim 16 wherein the first conductivity type is p-type and the second conductivity type is n-type.

21. The polarity insensitive anti-fuse of claim 16 wherein the first well region has a graded doping profile.

22. The polarity insensitive anti-fuse of claim 16 wherein both the first and second well region have graded doping profiles.

23. An anti-fuse fabricated on a silicon substrate of a first conductivity type, comprising:
a first lightly doped region of a second conductivity type formed in the substrate, the second conductivity type being opposite of the first conductivity type;
a second more heavily doped region of the second conductivity type formed in the substrate adjoining the first region;
a first well region of the second conductivity type formed in the substrate spaced apart from the first lightly doped and second more heavily doped regions and having a graded doping profile;

a shallower more lightly doped region of the second conductivity type within the first well region;
a first polysilicon layer formed on the first lightly doped region;
a dielectric layer formed on the first polysilicon layer;
a second polysilicon layer formed on the dielectric layer and extending above the first well region;
a first metal layer formed to contact the second polysilicon layer at a portion of the second polysilicon layer above the first well region; and
a second metal layer formed to contact the second more heavily doped region.

24. The anti-fuse of claim 23, further including a plurality of similarly constructed anti-fuses formed on the substrate, each of the anti-fuses having a respective first metal layer formed to contact a respective second polysilicon layer at a portion of the respective second polysilicon layer above the first well region.

25. The anti-fuse of claim 23, further including a field oxide region formed in the substrate between the first well region and the first lightly doped region.

26. The anti-fuse of claim 23 wherein the first well region has an expected depth of at least approximately 3 microns.

27. An anti-fuse fabricated on a silicon substrate of a first conductivity type, comprising:
a first lightly doped region of a second conductivity type formed in the substrate, the second conductivity type being opposite of the first conductivity type;
a second more heavily doped region of the second conductivity type formed in the substrate adjoining the first region;
a first well region of the second conductivity type formed in the substrate spaced apart from the first lightly doped and second more heavily doped regions and having a graded doping profile;
a second well region of the second conductivity type formed in the substrate so that the first lightly doped and second more heavily doped regions are formed within the second well region;
a first polysilicon layer formed on the first lightly doped region;
a dielectric layer formed on the first polysilicon layer;
a second polysilicon layer formed on the dielectric layer and extending above the first well region;
a first metal layer formed to contact the second polysilicon layer at a portion of the second polysilicon layer above the first well region; and
a second metal layer formed to contact the second more heavily doped region.

28. The anti-fuse of claim 27, further including a plurality of similarly constructed anti-fuses formed on the substrate, each of the anti-fuses having a respective first metal layer formed to contact a respective second polysilicon layer at a portion of the respective second polysilicon layer above the first well region.

29. The anti-fuse of claim 27, further including a field oxide region formed in the substrate between the first well region and the first lightly doped region.

30. The anti-fuse of claim 27 wherein the first well region has an expected depth of at least approximately 3 microns.

31. The anti-fuse of claim 27, wherein the first well region includes a shallower more lightly doped region of the second conductivity type.

* * * * *